US008969257B1

(12) United States Patent
Fresco et al.

(10) Patent No.: US 8,969,257 B1
(45) Date of Patent: Mar. 3, 2015

(54) COMBINATORIAL FLOW SYSTEM AND METHOD

(75) Inventors: Zachary Fresco, San Jose, CA (US); Rich Endo, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 1362 days.

(21) Appl. No.: 12/074,882

(22) Filed: Mar. 6, 2008

Related U.S. Application Data

(60) Provisional application No. 61/017,529, filed on Dec. 28, 2007.

(51) Int. Cl.
*C40B 50/14* (2006.01)

(52) U.S. Cl.
USPC .......................................................... 506/30

(58) Field of Classification Search
CPC ....... B01J 19/0046; C40B 50/04; C40B 50/14
USPC ................. 427/8–10; 118/712–714; 422/515; 506/30, 40
See application file for complete search history.

(56) References Cited

U.S. PATENT DOCUMENTS

| | | | | |
|---|---|---|---|---|
| 4,117,728 A * | 10/1978 | Johnson | ..................... | 73/864.18 |
| 4,835,553 A * | 5/1989 | Torpey et al. | ................... | 347/65 |
| 5,914,739 A * | 6/1999 | Zhang | ............................. | 347/71 |
| 6,008,010 A * | 12/1999 | Greenberger et al. | .......... | 435/41 |
| 7,010,391 B2 * | 3/2006 | Handique et al. | ............. | 700/266 |
| 2005/0003458 A1 * | 1/2005 | Moore et al. | ................... | 435/7.2 |
| 2008/0014589 A1 * | 1/2008 | Link et al. | ......................... | 435/6 |

* cited by examiner

*Primary Examiner* — Alex A Rolland

(57) ABSTRACT

A reactor assembly having a plurality of reaction chambers defined therein is provided. The reactor assembly includes a fluid flow module that provides a pressurized control flow of fluid from an open container. In another embodiment, the reactor block includes a plurality of passageways defined over a surface of a substrate to accommodate the combinatorial processing in order to obtain multiple data points from a single substrate.

13 Claims, 9 Drawing Sheets

COMBINATORIAL FLOW SYSTEM AND METHOD

CROSS-REFERENCE TO RELATED APPLICATION

This patent Application claims priority to U.S. provisional patent application No. 61/017,529 filed Dec. 28, 2007, entitled "COMBINATORIAL FLOW SYSTEM AND METHOD," which is incorporated herein by reference.

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor wet processing operations includes operations for adding (e.g., electro- or electroless depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

An improved technique for accommodating gathering of additional data for multiple process variations on a single substrate is provided to enhance the evaluation of the viability of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
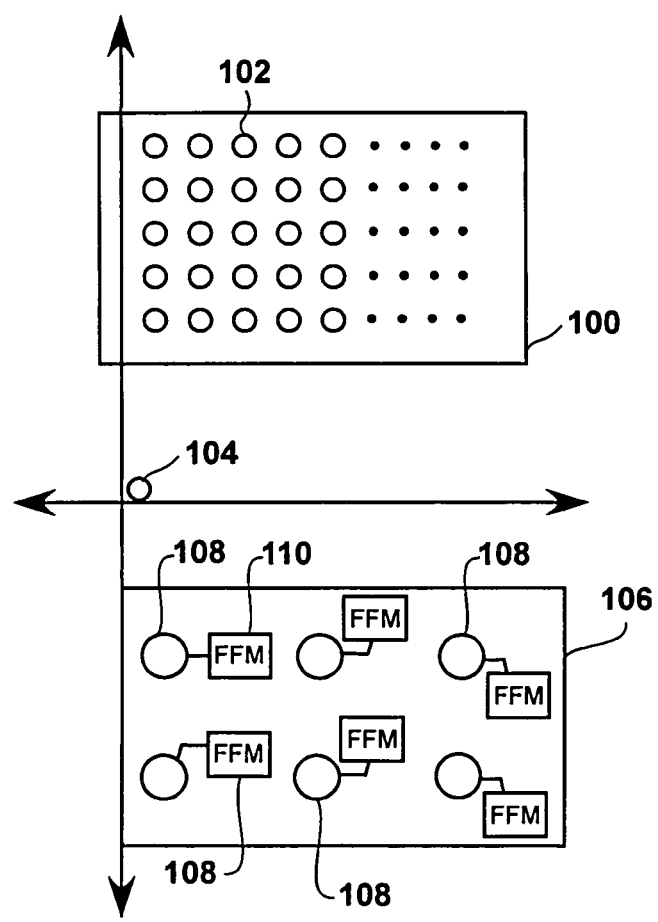
FIG. 1A is a simplified schematic diagram illustrating a combinatorial processing system in accordance with one embodiment of the invention.

The embodiments described herein provide a method and apparatus for performing combinatorial processing of semiconductor processing operations. It will be obvious, however, to one skilled in the art, that the present invention may be practiced without some or all of these specific details. In other instances, well known process operations have not been described in detail in order not to unnecessarily obscure the present invention.

The embodiments described herein enable the application of combinatorial techniques to process sequence integration, unit processes and material evaluation. Combinatorial processing applied to semiconductor manufacturing operations assists in arriving at a globally optimal sequence of semiconductor manufacturing operations by considering interaction effects between the unit manufacturing operations, the process conditions used to effect such unit manufacturing operations, as well as materials characteristics of components utilized within the unit manufacturing operations. Rather than only considering the series of local optimums, i.e., where the best conditions and materials for each manufacturing unit operation is considered in isolation, the embodiments described below consider interaction effects introduced due to the multitude of processing operations that are performed in the order in which such multitude of processing operations are performed when fabricating a semiconductor device. A global optimum sequence order is therefore derived and is part of this derivation, the unit processes, unit process parameters, and materials used in the unit process operations of the optimum sequence order are also considered.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequence used to build that portion of the device or structure. During the processing of some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures, or the action of the unit process is substantially uniform for each region. Furthermore, while different materials or unit process may be used for corresponding layers or steps in the formation of the structure, the application of each layer or use of a given unit process is substantially consistent or uniform throughout the different regions in which it is intentionally applied. It should be noted that the process can be varied between regions, for example, for a thickness of a layer is varied or one of various process parameters, such as a voltage, may be varied between regions, etc., as desired by the design of the experiment.

The result is a series of regions on the substrate that contains structures or unit process sequences that have been uniformly applied within that region and, as applicable, across different regions. This process uniformity allows comparison of the properties within and across the different regions such that variations and test results are due to the parameter being modified; e.g., materials, unit processes, unit process parameters, or process sequences, and not the lack of process uniformity.

The embodiments described below provide details for a multi-region processing system and associated reaction chambers that enable processing a substrate in a combinatorial fashion. Thus, different regions of the substrate may have different properties, which may be due to variations of the materials, unit processes, e.g., processing conditions or parameters, and process sequences. Within each region the conditions are preferably substantially uniform so as to mimic conventional full wafer processing within each region, however, valid results can be obtained for certain experiments without this requirement. In one embodiment, the different regions are isolated so that there is no interdiffusion or interaction between the different regions.

In addition, the combinatorial processing of the substrate may be combined with conventional processing techniques where substantially the entire substrate is uniformly processed, e.g., subjected to the same materials, unit processes, and process sequences.

Thus, the embodiments described herein can pull a substrate from a manufacturing process flow, perform combinatorial processing, and return the substrate to the manufacturing process flow for further processing. Alternatively, a substrate can be processed in an integrated tool that allows both combinatorial and conventional processing in various chambers attached around the central chamber. Consequently, in one substrate, information concerning the varied processes and interaction of the varied processes with conventional processes can be evaluated. Accordingly, a multitude of data is available from a single substrate for desired process.

The embodiments described below provide for the influencing of wet processing operations within a reaction chamber for a combinatorial processing system. Through some of the embodiments described below, a forced flow from an open container is enabled so that processing conditions for site isolated regions can mimic processing conditions for conventional full processing operations when using an open deck configuration. In addition, or alternatively, the reactor block design may enable channels of fluid flows over the surface of a substrate being processed so that different regions of the substrate are processed differently. In one embodiment, each of the channels may include one or more windows or shutters so that the channel includes a plurality of regions where operating parameters or materials may be varied.

FIG. 1A is a simplified overhead schematic diagram illustrating a combinatorial processing system in accordance with one embodiment of the invention. The combinatorial processing system of FIG. 1 includes deck 100 having a plurality of vials 102 disposed thereon. Vials 102, which can be any suitable containers, can include any chemical compositions, fluids, etc., that may be used to evaluate semiconductor processing wet chemistry techniques in accordance with one embodiment of the invention. It should be appreciated that vials 102 may be open containers. Reaction block 106 contains a plurality of reaction chambers 108 disposed thereon. A transfer mechanism 104 is used to transfer the chemicals from the vials 102 and into the reaction chambers 108 for combinatorial processing. Vials 102 may contain individual source components and transfer mechanism 104 may transfer multiple components in various proportions to each of the reaction chambers 108. In this fashion a great deal of chemical complexity can be generated from relatively few source components. In communication with each reaction chamber 108 is a forced fluid mechanism 110. Forced fluid mechanism (FFM) 110 pressurizes solutions prepared in chambers 108 to create a forced flow through the reaction chambers 108 of module 106. In one embodiment, transfer mechanism 104, which may be referred to as a transfer container, is capable of moving in a planar direction as well as a vertical (Z) direction in order to capture or obtain the fluids within vials 102 and provide these fluids to a container of forced flow mechanisms 110. In one embodiment, a syringe pump is used to withdraw the fluid, a portion of the fluid, or a combination of fluids from vials 102 and transfer them to transfer container 104. Any bi-directional flow pump may be utilized in place of a syringe pump. Transfer container 104 will then move to dispense the fluid to a staging vessel forced flow mechanism 110 as will be described in more detail below. Reaction block 106 is disposed over a substrate. The embodiments described herein enable combinatorial processing of the substrate where the substrate may have pre-defined regions corresponding to the locations of reaction chambers 108 in one embodiment. In another embodiment, the reaction chambers 108 may define the regions on the substrate below module 106. For example, a blanket substrate may be used for evaluation where the reaction chambers 108 define the regions. The regions on the substrate may or may not have structures defined thereon. That is the substrate may be a blanket substrate or structures, e.g., semiconductor features, may be defined on the substrate for combinatorial processing.

Figure 1B:
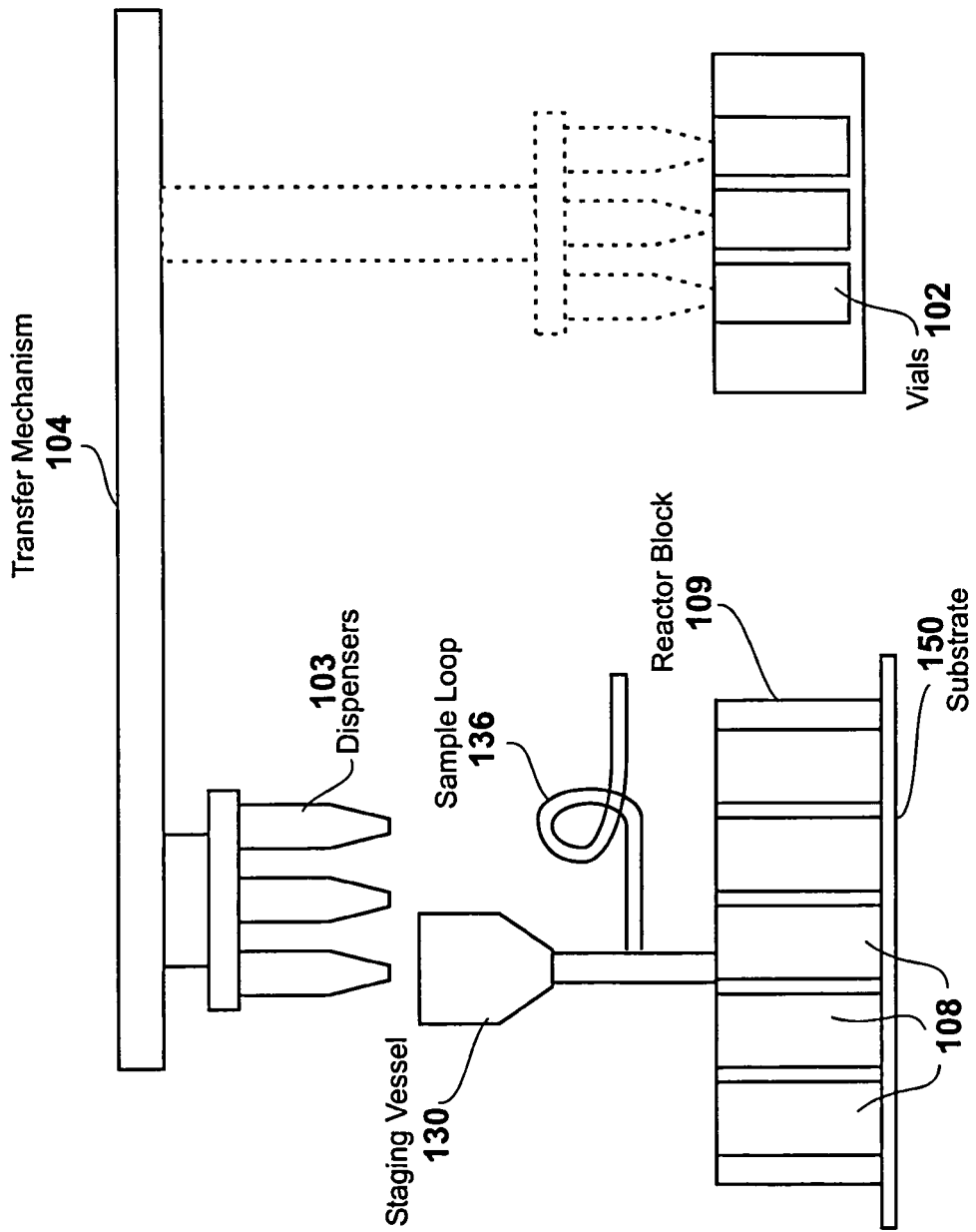
FIG. 1B is a simplified schematic diagram illustrating a side view of a combinatorial processing system in accordance with one embodiment of the invention.

FIG. 1B is a simplified schematic diagram illustrating a side view of a combinatorial processing system in accordance with one embodiment of the invention. Transfer mechanism 104 includes an arm that is moveable in three dimensions (X, Y, and Z planes). Attached to the arm are three dispensers 103 that extract fluid from vials 102 and deliver the extracted fluid to staging vessel 130. As mentioned below, the fluid may be extracted in parallel from vials 102 and then delivered serially to staging vessel 130 so that the processing performed within a reaction chamber 108 of reactor block 109 on a surface of substrate 150 mimics a multi-step semiconductor processing step. In another embodiment, the dispensers 103 may dispense in parallel or serial-parallel fashions. In one embodiment, sample loop 136 (also referred to as a segment, which may have any shape, size, or configuration) may be sized to fit multiple fluids and then sequentially dispense these multiple fluids. In another embodiment, multiple sample loops 136 and/or multiple sample loop 136/staging vessel 130 units may be provided, for example, one for each reaction chamber 108. Certain aspects of this and other embodiments may include an individual dispenser 103 for each reaction chamber 108. Each dispenser 103 can then be lowered into a staging vessel 130, and liquid is dispensed into the staging vessel 130 and pressurized using a pump and the sample loop 136 as described below. It should be appreciated that the embodiment of FIG. 1B is exemplary and not meant to be limiting as any number of dispensers 103, as well as staging vessel 130 and sample loop 136 units may be provided.

Figure 2:
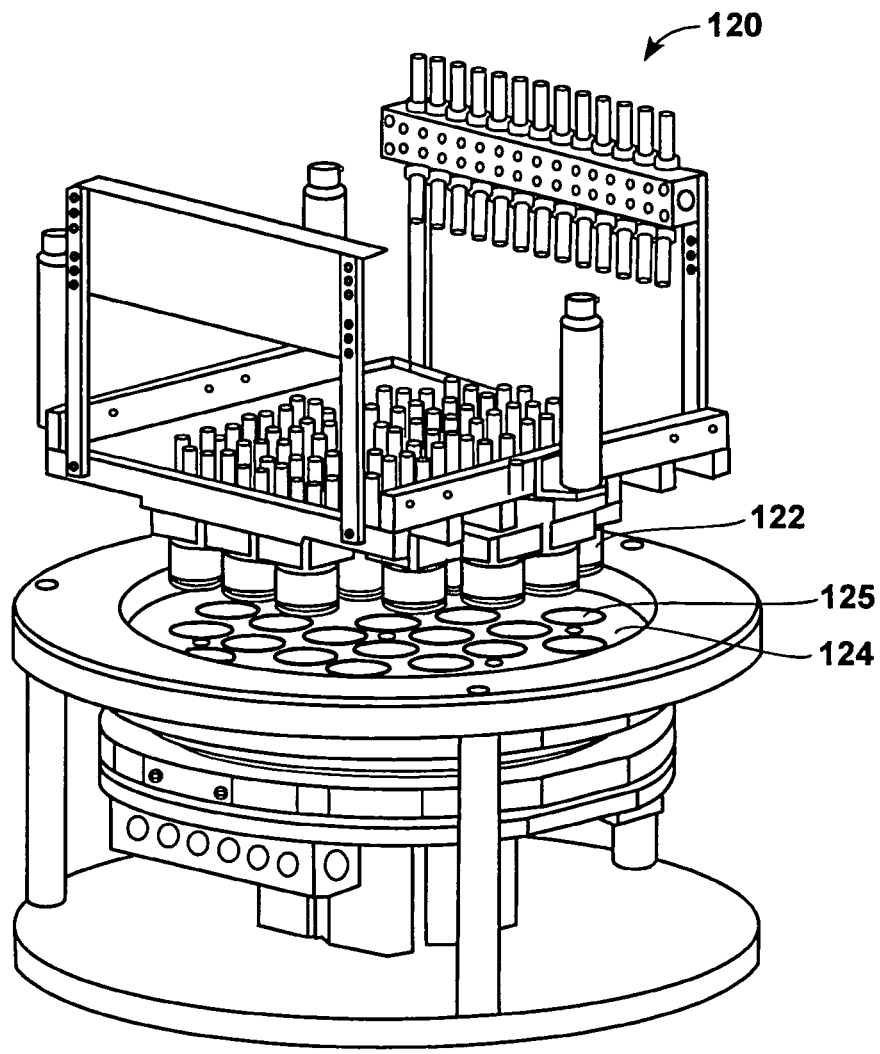
FIG. 2 is a simplified schematic diagram illustrating a perspective view of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with one embodiment of the invention.

FIG. 2 is a simplified schematic diagram illustrating a perspective view of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with one embodiment of the invention. It should be appreciated that FIG. 2 is an alternative processing system to FIG. 1. However, it should be appreciated that the embodiments described herein are not limited to a particular processing system and may be incorporated with any combinatorial processing system. System 120 includes a plurality of flow cells 122 which may be modular in design in one embodiment. FIG. 2 illustrates a total of 28 flow cells provided for 28 discrete regions of a 12-inch wafer. It should be noted that this is not meant to be limiting as any number of flow cells may be accommodated on system 120 depending on various factors including the size and shape of the substrate being evaluated, the size of the regions of the substrate, etc. System 120 includes a plurality of connections (not shown for illustrative purposes) distributed to each of flow cells 122. The fluid flow mechanisms of FIG. 1 are each in flow communication with corresponding flow cells 122 of FIG. 2 in one embodiment. In another embodiment, the fluid flow mechanisms may be shared among more than one flow cell. The illustration within FIG. 2 depicts flow cells 122 and corresponding rack system elevated above reactor block 124 in order to illustrate reactor block 124 more clearly. Reactor block 124 includes a plurality of reaction chambers 125 which mate with corresponding flow cells 122. It should be appreciated that the combinatorial system provided herein enables combinatorial processing to be applied to a substrate, such as a semiconductor substrate, so that different regions of the substrate are processed differently either in parallel, serial or some combination of parallel/serial processing. In one embodiment, the wet processing operations typically performed during semiconductor manufacturing operations are varied either in terms of materials, process conditions, unit operations, or process sequences so that a single substrate yields a plethora of data through the differently processed regions. As illustrated below, each of the reaction regions defined on the surface of the substrate may be processed differently by modifying the fluids delivered to the different fluid flow mechanisms or varying the processing conditions within the fluid flow mechanisms. The regions on the substrate may be pre-defined in one embodiment. In another embodiment, the regions are defined by the reactors.

Figure 3:
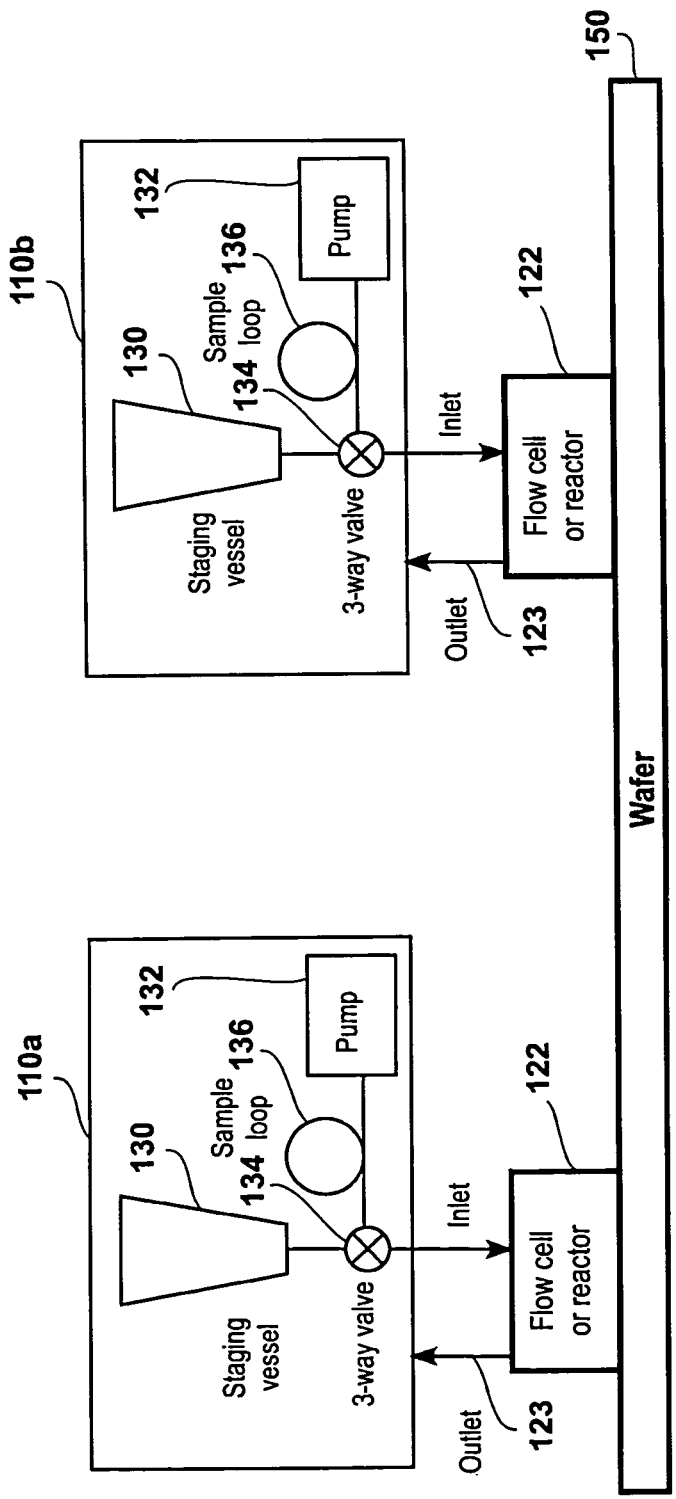
FIG. 3 is a simplified schematic diagram illustrating further details on the forced flow mechanism for a combinatorial processing system in accordance with one embodiment of the invention.

FIG. 3 is a simplified schematic diagram illustrating further details on the forced flow mechanism for a combinatorial processing system in accordance with one embodiment of the invention. Forced flow mechanisms 110a and 110b include staging vessel 130, three-way valve 134, pump 132, and sample loop 136 connecting three-way valve 134 to pump 132. Sample loop 136 may more generally be a sample segment having any shape, including other configurations such as a straight segment of tubing. Additionally, any type of reservoir may be used in place of sample loop 136. Staging vessel 130 receives material from the containers of deck 100 with reference to FIG. 1 via transfer container 104 in one embodiment. For example, the transfer mechanism 104 may include a dispenser that dispenses solutions into the staging vessel 130. Returning to FIG. 3, staging vessel 130 is an open vessel which is in flow communication with three-way valve 134. Three-way valve 134 may be any suitable three-way or multi-way valve compatible with the chemicals being used in the processing. Staging vessel 130 provides fluid to three-way valve 134 through gravity in one embodiment. Sample loop 136, which provides a flow path between three-way valve 134 and pump 132, may be any suitable size of any suitable material compatible with the chemicals used in the processing operations. Prior to filling the staging vessel 130 the sample loop may already be filled with de-ionized water or another backing solvent. The role of the backing solvent is to provide an incompressible fluid so as to maintain syringe accuracy as well as to provide access to clean water or solvent in order to rinse the system. The sample loop 136 is generally configured such that the total internal volume is greater than the volume of the syringe. This prevents mixing of the solutions with fluid that may already be in the line and prevents the syringe from becoming contaminated. In one embodiment, a small air bubble may be introduced into sample loop 136 so that separation is maintained from a fluid being dispensed into the fluid cell and a backing solvent. This prevents diffusion of chemicals between the sample and the backing solvent. The air bubble may be inserted into the sample line so that the air bubble is not dispended into the flow cell or so that part of the bubble is in the tube and part enters the valve when the fluid is dispensed into the flow cell. In one embodiment, sample loop 136 is jacketed or otherwise heated in order to pre-heat a solution being delivered to flow cell 122. Pump 132 provides bi-directional flow in order to obtain material from staging vessel 130 and force the material into flow cell 122 through a corresponding inlet upon transition of three-way valve 134. In one embodiment, outlet 123 of flow cell 122 includes a restriction device that restricts fluid flow in order to pressurize the flow within flow cell 122. The restriction device may be an orifice within the flow path in one embodiment. Flow cell 122 is disposed over substrate 150. Flow cell 122 may function as the reaction chamber 108 in one embodiment. In another embodiment, flow cell 122 may be the flow cell illustrated with reference to FIG. 5. It should be noted that pump 132 may be any type of pump that provides bidirectional flow, such as syringe pumps, peristaltic pumps, etc. While the embodiments described herein provide an exemplary flow cell, this is not meant to be limiting as numerous flow patterns over wafer 150 may be provided through appropriate configuration of the reactor block and inserts provided within each of the reaction chambers. For example, flow cell 122 may be an insert defining a plurality of channels across a surface of wafer 150 and as described further with reference to FIGS. 7A and 7B.

Figure 4:
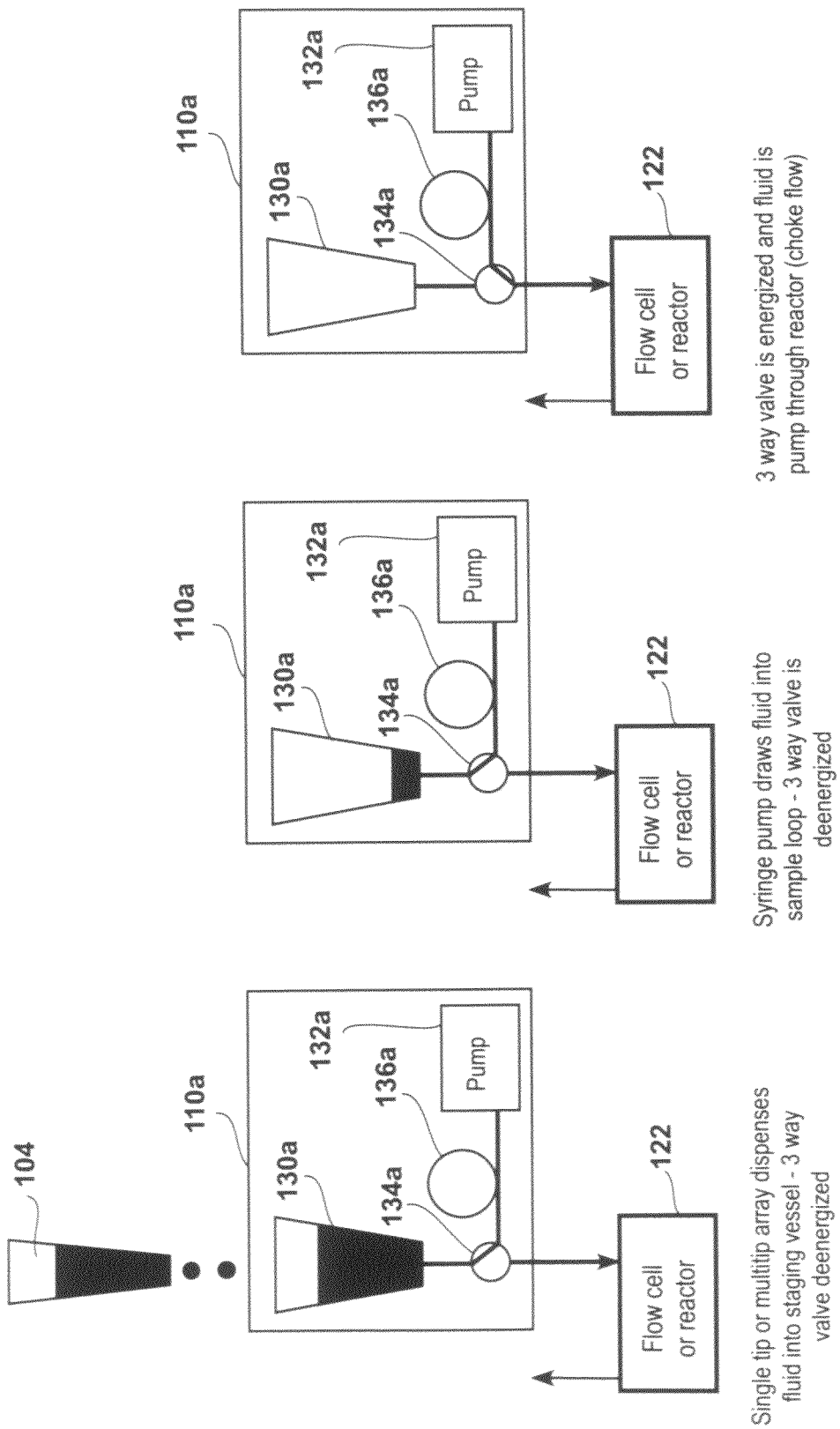
FIGS. 4A through 4C are simplified schematic diagrams illustrating the operation of the fluid flow mechanism in accordance with one embodiment of the invention.

FIGS. 4A through 4C are simplified schematic diagrams illustrating the operation of the fluid flow mechanism in accordance with one embodiment of the invention. Transfer mechanism 104 delivers fluid or a mixture of fluids to staging vessel 130a of fluid flow mechanism 110a in FIG. 4A. Upon completion of delivery of the appropriate amount of fluids to staging vessel 130a, pump 132a will activate in order to withdraw the fluid from staging vessel 130a into sample loop 136a through three-way valve 134a. In FIG. 4B, sample loop 136a is filled with fluid as described above. The sample loop may be heated in one embodiment. As illustrated with reference to FIG. 4C, pump 132a will then activate upon transition of three-way valve 134a to direct flow to flow cell 122. Thus, a forced flow is provided through a closed system consisting of bidirectional pump 132a, sample loop 136a, flow cell 122, which is in communication with sample loop 136a through three-way valve 134a. The forced flow can then be manipulated through various configurations within flow cell 122 to provide flow across a wafer from one peripheral edge to another or radial flow from a center region of the wafer toward the peripheral regions. Numerous configurations for the flow are available based on the design of flow cell 122. The embodiments described herein enable the forced flow from an open container, i.e., staging vessel 130*a*, which further may allow use of a combinatorial processing system such as shown in FIGS. 1A and 1B (i.e., a combinatorial processing system that transfers solutions from vials into an open vessel). This may allow such a combinatorial processing system to perform processing using both batch processing as well as flow processing. Accordingly, numerous types of experiments can be run by enabling the forced flow and eliminating the restrictions associated with gravity-fed flow. For example, gravity-fed flow may describe a processing device where liquids are dispensed from dispensers directly into a reaction chamber. Gravity-fed flow systems may not be able to generate pressurized flow that may be needed for some combinatorial processes.

In another embodiment multiple formulations may be sequentially dispensed into the staging vessel and primed into the sample loop. In this embodiment the sample loop contains different formulations in different regions along its length. When this series of mixtures is dispensed to the reactor the effect is a multi-step processing sequence. Alternatively a multi-way valve at the bottom of the staging vessel may be connected to multiple pumps allowing sequencing by priming different fluids into different lines.

Figure 5:
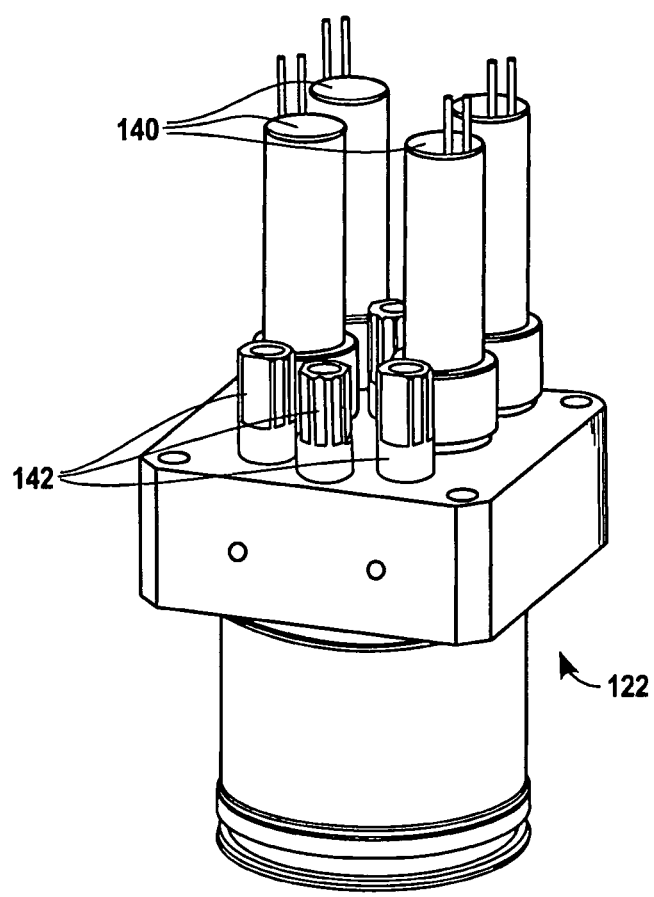
FIG. 5 is a simplified schematic diagram illustrating a flow cell in accordance with one embodiment of the invention.

FIG. 5 is a simplified schematic diagram illustrating a flow cell in accordance with one embodiment of the invention. Flow cell 122 includes valves 140 which are manipulated in order to route flows of fluid delivered through inlets 142. Accordingly, a plurality of fluids may be provided to flow cell 122 and based on the manipulation and channels within flow cell 122 numerous combinations or types of flows may be provided to a reaction region defined under a bottom surface of flow cell 122. It should be appreciated that numerous types of flow cells may be provided for the embodiments described herein in that the flow cell type is not meant to be restrictive as flow cell 122 is one exemplary type of flow cell. For example, a radial flow may be provided from a centrally located outlet in one embodiment. In another embodiment, flow from one peripheral edge to another edge of the flow cell may be provided through the fluid lanes described herein. In one embodiment, the flow cells may be modular flow cells having a top and bottom portion. In addition, the flow cells may include attachments that may provide stirring/agitation, scrubbing, brushing, electrical potentials, etc.

Figure 6A:
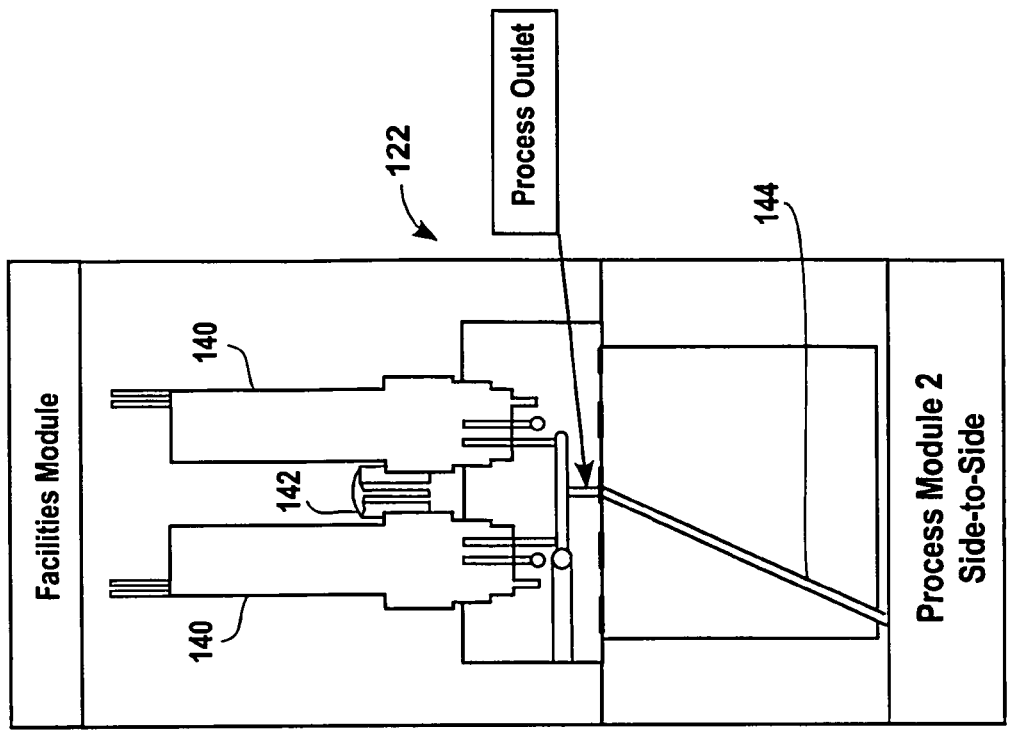
FIGS. 6A and 6B illustrate various flow patterns enabled by flow cell 122 in accordance with one embodiment of the invention.
Figure 6B:
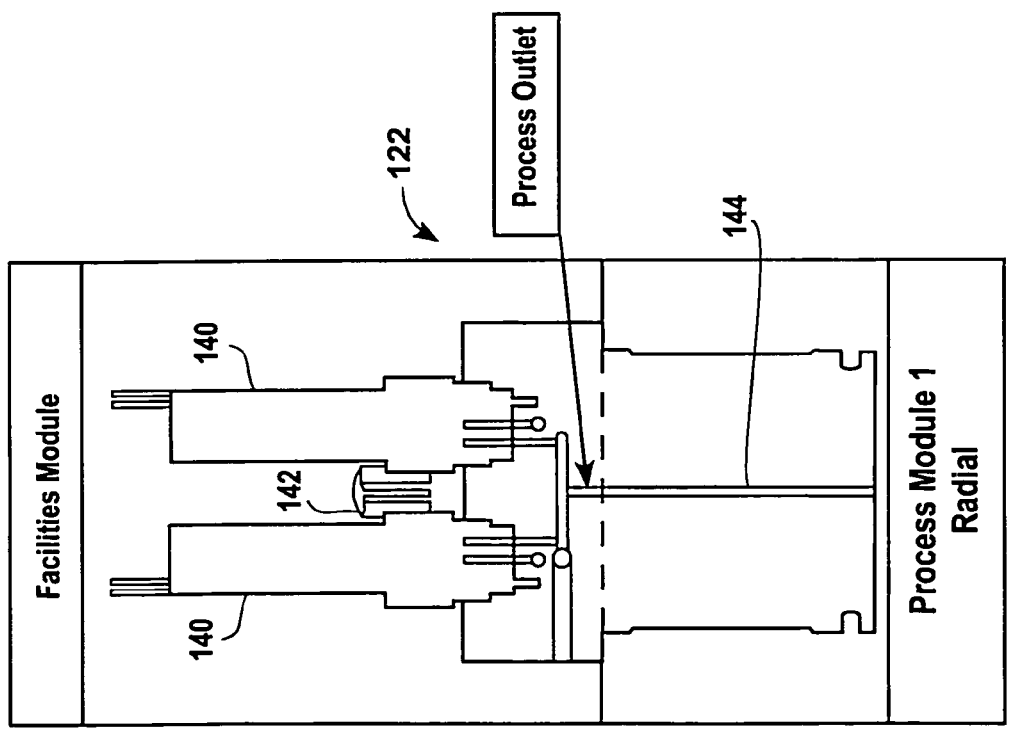

FIGS. 6A and 6B illustrate various flow patterns enabled by flow cell 122 in accordance with one embodiment of the invention. In FIG. 6A, flow cell 122 provides a radial flow through a central channel 144. Process inlet 142 enables delivery of fluids to flow cell 122, and based upon the positioning of valves 140 and internal channels within flow cell 122 a fluid or combinations of fluids may be provided through a radial flow within a reaction region defined under a bottom surface of flow cell 122. In FIG. 6B, flow cell 122 provides a side-to-side flow, from one peripheral edge of the region under flow cell 122 to an opposing peripheral edge. Here, channel 144 is directed from a center region of flow cell 122 to a lower peripheral region of flow cell 122 in order to enable the side-to-side flow. Again, FIGS. 6A and 6B are illustrative and not meant to be restrictive as numerous other flow types may be provided, as well as different flow cells.

Figure 7A:
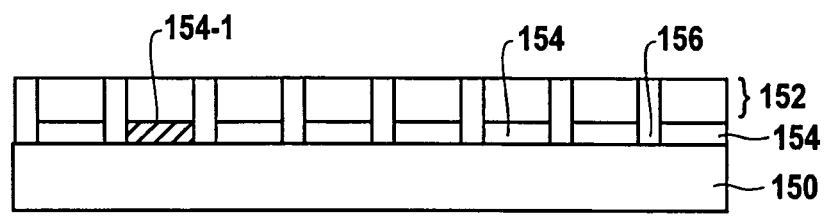
FIGS. 7A and 7B illustrate one alternative flow cell pattern for providing a plurality of channels across a substrate in accordance with one embodiment of the invention.
Figure 7B:
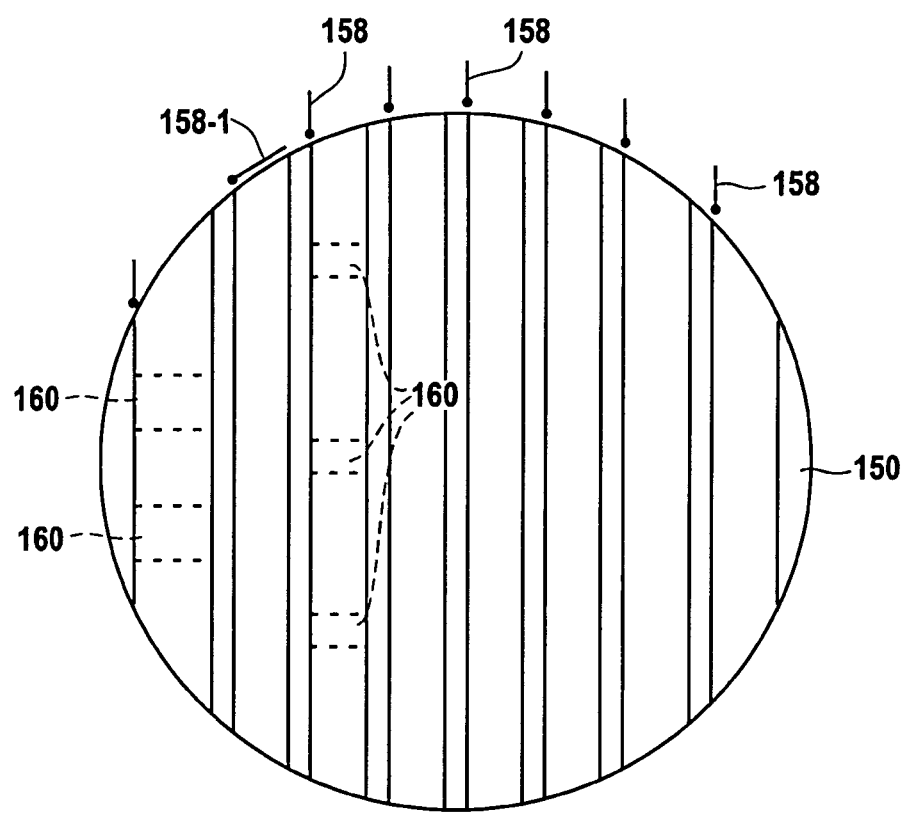

FIGS. 7A and 7B illustrate a flow cell pattern for providing a plurality of channels across a substrate in accordance with one embodiment of the invention. In FIG. 7A, flow pattern block 152 is disposed over substrate 150 and may function as a flow cell in one embodiment. Flow pattern block 152 includes a number of flow gaps 154 that are partitioned from each other by walls 156. It should be appreciated that flow cell block 152 may be a monolithic block in one embodiment. In another embodiment, numerous pieces or partitions may be put together in order to provide the pattern of lanes defined through gaps 154. The flow pattern block 152 can provide fluid flow to various regions of a substrate that are defined by the walls, thereby enabling different (i.e., combinatorial) processes to occur on the substrate 150. In addition, flow pattern block 152 can have the ability to close certain gaps 154 in order to customize the flow pattern over the surface of the substrate 150. For example, gap 154-1 is illustrated as closed in this embodiment. One type of mechanism enabled to close off access to gap 154 is a door or louver type mechanism 158 of FIG. 7B that opens and closes access to gap 154. It should be appreciated that the materials for flow cell block 152 may be any suitable composition compatible with the chemicals used for the processing. For example, certain inert compositions may include synthetic fluoropolymers, e.g., polytetrafluoroethylene (PTFE), or other compounds, such as, Polyetheretherketones (PEEK), and the like. In some embodiments, flow pattern block 152 is designed such that laminar flow can be achieved across the substrate 150. For example, the gaps 154 are configured (e.g., by varying heights of the gaps relative to the substrate 150) such that when fluids are flown through them at a certain flow rate, the flow is laminar.

FIG. 7B illustrates a top view of the pattern enabled by flow cell block 152 of FIG. 7A. It should be appreciated that flow cell block 152 may define a plurality of flow lanes in one embodiment. Substrate 150 includes a plurality of flow lanes. Access to each of the flow lanes is provided through doors 158. Doors 158 may pivot around a certain point to open and close access to corresponding flow lanes. As illustrated, door 158-1 is closed while remaining doors 158 are open. Thus, the flow of fluid is restricted from the lane corresponding to door 158-1. In another embodiment, each of the fluid lanes may enable access to a window or windows within each lane. For example, lane one enables access to two windows 160, while lane three enables access to three windows 160. The windows 160 are positioned over the substrate 150 so that when the windows 160 are retracted or in place, portions or all of the substrate 150 can be exposed to heat or other radiation (e.g., electromagnetic radiation such as ultraviolet light), or other environmental factors (e.g., vapors). Additionally, the windows 160 may be made of transparent or translucent materials that allow portions of the substrate 150 to be differentially exposed to radiation such as electromagnetic radiation. It should be appreciated, that depending on the layout of the windows 160, numerous patterns may be applied to the surface of the substrate 150, e.g., checkerboard type patterns. In addition, wafer 150 may be rotated 90 degrees to enable a second set of flow lanes to be substantially orthogonal to a first set of flow lanes. For example, the substrate 150 may be processed using a first set of fluids, and the block 152 may be rotated 90 degrees, and the substrate 150 processed again with a second set of fluids. In this embodiment, a checkerboard pattern may also result. It should be appreciated that while the shapes for the regions being processed have been described in terms of quadrilateral shapes, i.e., checkerboard patterns, this is not meant to be limiting. In one embodiment, windows 160 may have a circular shape corresponding to or defined by the reactor chambers of a reactor block, such as the reactor block of FIG. 2. It should be appreciated that window 160 may be affixed to a top surface to block 152 through a hinge or some other suitable surface and/or mechanism.

Figure 8:
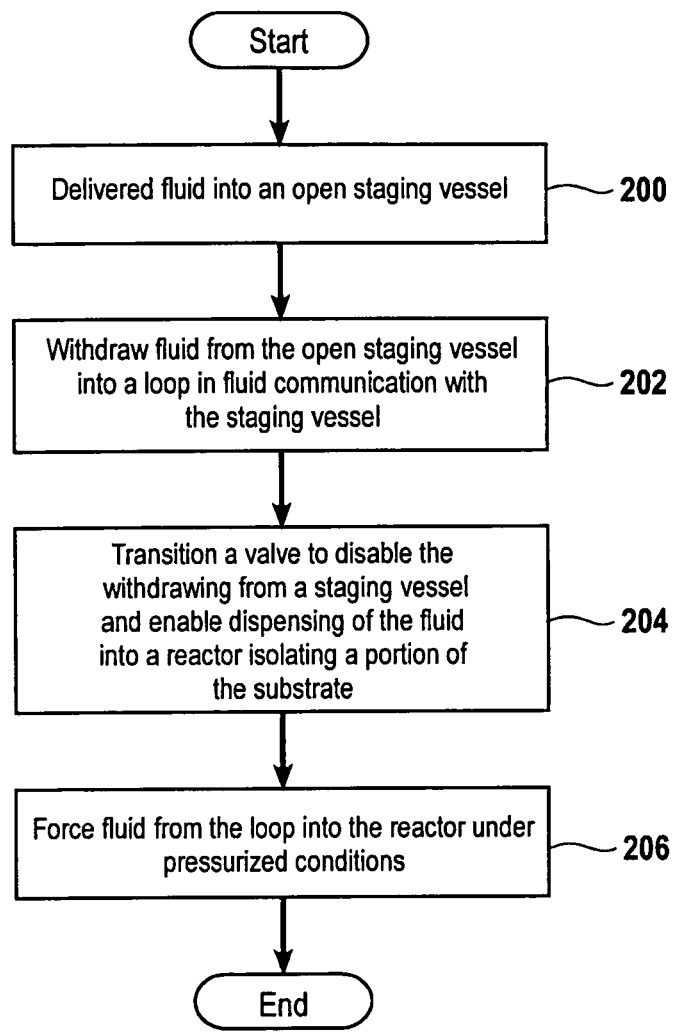
FIG. 8 is a flow chart diagram illustrating the method operations for combinatorially processing the substrate in accordance with one embodiment of the invention.

FIG. 8 is a flow chart diagram illustrating the method operations for combinatorially processing the substrate in accordance with one embodiment of the invention. FIG. 8 initiates with operation 200 where a fluid is delivered into an open staging vessel. In one embodiment, the fluid is delivered from a deck of vials or containers so that numerous combinations of the material in the containers may be delivered to the open staging vessel. As described above, a bidirectional pump may be used to withdraw the fluid from a first area and dispense the fluid to the staging vessel. The fluid may be a combination of fluids for evaluation of stoichiometric amounts of components. One skilled in the art will realize that the fluid combinations may be controlled through a computing device and specified through a recipe, i.e., program instructions, executed by the computing device. The method then proceeds to operation 202 where the fluid is withdrawn from the open staging vessel into a loop in fluid communication with the staging vessel. The amount of fluid utilized may vary as required by the process operation being combinatorially executed, and in one exemplary embodiment, the amount of fluid is between about 1 and 100 milliliters. The volume of the sample tube or loop holding the fluid is slightly larger than a volume that the pump withdraws in one embodiment. As described with regard to FIGS. 4A through 4C, the fluid is withdrawn through a three-way valve into a sample loop by a bi-directional pump in one embodiment. The method then advances to operation 204 where a valve is transitioned to disable the withdrawing from a staging vessel and enable dispensing of the fluid into a reactor isolating a portion of the substrate. Again, with reference to FIGS. 4A through 4C, a three-way valve will transition to enable access to a flow cell and the bi-directional pump will switch directions and dispense the fluid from the sample loop into the flow cell, thereby providing a forced flow through the flow cell. The method then proceeds to operation 206 where the fluid is forced from the loop into the reactor. The forced flow provides greater flexibility in designing experiments as well as mimicking actual conditions for semiconductor full wafer processing operations.

In summary, the embodiments described above provide for the aspiration of a fluid from an open vessel and thereafter providing a forced flow through a flow cell to combinatorially process a substrate. Numerous patterns may be applied either through rotation of the substrate, configuration of the flow cell, or a combination of both. While the embodiments have been described with regard to wet chemical processing operations, this is not meant to be limiting. That is, the embodiments may be extended to use with gas flow operations also.

It should be appreciated that the embodiments described herein accommodate a multi-channel site-isolated reactor having electrical contacts on a surface of a substrate undergoing combinatorial processing. The contacts may be positioned within a reaction region or outside a reaction region. The contacts, coupled to leads in communication with monitoring devices or power supplies external to the reaction chambers, enables manipulation and/or monitoring of the reactions taking place in the reaction chambers. These localized contacts provide for accurate measurements and providing accurate potentials to each of the isolated regions, even as seed layers become thinner and give rise to discontinuities when attempting to connect to a peripheral region of the substrate being evaluated. As mentioned above, a monitoring circuit may measure capacitance as a chemical reaction is taking place. In this embodiment, the test substrate includes a capacitor circuit. Some exemplary operations where this would be useful include electro-less depositions and etching operations. One skilled in the art will appreciate that resistance may also be measured through this embodiment. In another embodiment a resistance thermal detector or thermistor may be included in the test substrate, thereby enabling the temperature of the substrate to be monitored while the reaction is taking place. In embodiments influencing the reaction taking place, the contacts may be connected to a voltage potential plane, thereby enabling the voltage potential for the reaction to be controlled by external equipment. In another embodiment, the voltage potential planes are separated or isolated from voltage potential planes in adjacent reaction regions so that the voltage may be varied from region to region, further enhancing the combinatorial capabilities of the system for electrodeposition processes, among other semiconductor processes in which a variable voltage may impact a result of the process. Thus, the embodiments enable real time comparative analysis of differential processing through the conductive leads and corresponding power supply/monitoring equipment.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for combinatorially processing a substrate, the method comprising:
   delivering a first fluid to an open staging vessel;
   withdrawing the first fluid from the open staging vessel into a segment in fluid communication with the staging vessel;
   delivering a second fluid, different from the first fluid, to the open staging vessel;
   withdrawing the second fluid from the open staging vessel into the segment wherein the first and second fluids are disposed with the segment;
   transitioning a valve to disable the withdrawing and enable dispensing of the fluid into a reactor isolating a portion of the substrate, wherein the reactor comprises an outlet;
   forcing the second fluid from the segment into the reactor such that the second fluid flows from the reactor through the outlet of the reactor;
   forcing the first fluid from the segment into the reactor after the second fluid is forced from the segment such that the first fluid flows from the reactor through the outlet of the reactor; and
   restricting the flow of the second fluid and the first fluid through the outlet of the reactor such that the second fluid and the first fluid are pressurized within the reactor.

2. The method of claim 1, wherein the withdrawing of the second fluid from the open staging vessel into the segment comprises introducing an air bubble into the segment between the first fluid and the second fluid to prevent diffusion between the first fluid and the second fluid.

3. The method of claim 2, wherein multiple distinct fluids are delivered to the open stage vessel prior to the withdrawing of the first or the second fluid, and wherein multiple mixtures are drawn into the segment sequentially such that when the multiple mixtures are dispensed to the reactor the multiple mixtures effect a multistep processing sequence.

4. The method of claim 1, wherein when dispensing the first or the second fluid into the reactor, the first or the second fluid traverses across multiple isolated lanes defined on a surface of the substrate.

5. The method of claim 1, wherein when dispensing the first or the second fluid into the reactor, the first or the second fluid travels radially over a surface of the substrate.

6. The method of claim 1, wherein the forcing of the first or the second fluid defines a laminar fluid flow.

7. The method of claim 1, further comprising: heating the first or the second fluid in the segment during the forcing of the first or the second fluid.

8. The method of claim 1, wherein multiple regions of the substrate are processed differently in one of serial, parallel, or serial-parallel.

9. A method for processing a substrate, the method comprising:
   positioning an open staging vessel above a substrate, wherein the open staging vessel is coupled to a pump and a reactor comprising an outlet through a valve, and wherein the valve is configured such that when the valve is in a first configuration, the open staging vessel is in fluid communication with the pump and not the reactor, and when the valve is in a second configuration, the pump is in fluid communication with the reactor and not the open staging vessel;
   dispensing a liquid into the opening staging vessel;
   setting the valve to the first configuration;
   withdrawing the liquid from the open staging vessel and through the valve with the pump;
   setting the valve to the second configuration;
   delivering the liquid through the valve and into the reactor such that the liquid flows from the reactor through the outlet of the reactor, wherein when the liquid is in the reactor, the liquid is in contact with the substrate; and
   restricting the flow of the liquid through the outlet of the reactor such that the liquid within the reactor is pressurized.

10. The method of claim 9, wherein the valve is in fluid communication with the pump through a segment of tubing, and wherein when the liquid is withdrawn from the open staging vessel and through the valve, the liquid flows into the segment of tubing.

11. The method of claim 10, further comprising filling the segment of tubing with a second liquid before the dispensing of the liquid into the open staging vessel.

12. The method of claim 11, further comprising introducing an air bubble in the segment of tubing between the liquid and the second liquid to prevent diffusion between the liquid and the second liquid.

13. The method of claim 12, wherein the open staging vessel is positioned relative to the valve such that the liquid in the open staging vessel is provided to the valve via gravity.

* * * * *